United States Patent [19]

Silverio

[11] Patent Number: 5,159,536

[45] Date of Patent: Oct. 27, 1992

[54] PANEL BOARD
[75] Inventor: Shaun D. Silverio, Beverly, Mass.
[73] Assignee: Mupac Corporation, Brockton, Mass.
[21] Appl. No.: 193,924
[22] Filed: May 13, 1988
[51] Int. Cl.$^5$ .............................................. H05K 7/02
[52] U.S. Cl. .................................. 361/400; 174/255;
174/261; 361/409; 361/414; 361/417; 361/419;
439/70
[58] Field of Search ............. 174/68.5, 250, 251,
174/260, 261, 264, 267, 255; 361/414, 397, 400,
407, 410, 412, 413, 416, 417, 403, 409, 419;
439/45, 46, 47, 48, 75, 85, 68, 70, 71–73

[56] References Cited

U.S. PATENT DOCUMENTS

| | | | |
|---|---|---|---|
| 3,250,848 | 5/1966 | Beelitz et al. | 174/68.5 |
| 3,324,224 | 6/1967 | Thibodeau | 174/35 |
| 3,325,766 | 6/1967 | Kolb et al. | 361/409 |
| 3,344,515 | 10/1967 | Schuster et al. | 29/628 |
| 3,372,310 | 3/1968 | Kantor | 317/101 |
| 3,516,156 | 6/1970 | Steranko | 439/85 |
| 3,519,959 | 7/1970 | Bewley et al. | 333/6 |
| 3,568,000 | 3/1971 | D'Aboville et al. | 317/101 |
| 3,680,005 | 7/1972 | Jorgensen et al. | 361/414 |
| 3,891,898 | 6/1975 | Damon | 361/406 |
| 3,895,435 | 7/1975 | Turner et al. | 29/625 |
| 3,927,925 | 12/1975 | Borsuk | 439/109 |
| 3,932,932 | 1/1976 | Goodman | 29/625 |
| 4,004,196 | 1/1977 | Doucet | 439/85 |
| 4,054,939 | 10/1977 | Ammon | 361/414 |
| 4,295,182 | 11/1981 | Aubusson et al. | 361/406 |
| 4,330,684 | 5/1982 | Hayward | 174/68.5 |
| 4,362,899 | 12/1982 | Borrill | 174/36 |
| 4,434,321 | 2/1984 | Betts | 361/409 |
| 4,494,172 | 1/1985 | Leary et al. | 361/400 |
| 4,498,122 | 2/1985 | Rainal | 361/414 |
| 4,524,240 | 6/1985 | Stock et al. | 174/68.5 |
| 4,602,271 | 7/1986 | Dougherty, Jr. et al. | 357/80 |
| 4,675,789 | 6/1987 | Kuwabara et al. | 174/68.5 X |
| 4,688,151 | 8/1987 | Kraus et al. | 361/414 X |
| 4,736,266 | 4/1988 | Tanibe | 361/414 |
| 4,754,371 | 6/1988 | Nitta et al. | 174/68.5 X |
| 4,799,128 | 1/1989 | Cheu | 361/414 |
| 4,803,595 | 2/1989 | Kraus et al. | 174/68.5 X |

FOREIGN PATENT DOCUMENTS

| | | | |
|---|---|---|---|
| 0145549 | 6/1985 | European Pat. Off. | 439/70 |
| 2806246 | 10/1978 | Fed. Rep. of Germany | 361/406 |
| 1440894 | 6/1976 | United Kingdom | 439/109 |
| 3635796 | 5/1988 | United Kingdom | 439/47 |

OTHER PUBLICATIONS

Mupac, High Speed Packaging Systems, Catalog (1984–85).
Mupac, Pin Grid Array & Dip Sockets, Catalog (1987).
Visco, A., "Coaxing top bipolar speeds from prototyping boards", Electronic Products Magazine, Sep., 1987.
Chapman, et al., "Ultra-High Performance Wire Wrap Boards", Sep., 1987.

Primary Examiner—Leo P. Picard
Assistant Examiner—Donald A. Sparks
Attorney, Agent, or Firm—Fish & Richardson

[57] ABSTRACT

A multilayer panel board for mounting electronic components that have respectively different voltage requirements at specific leads of the components; in the board, conductive layers carry the different voltages across the board; terminals at locations across the board receive leads of the electronic components, some of these terminals being electrically connected directly to selected conductive layers at the locations to deliver corresponding voltages from the conductive layers to the specific leads; and the terminals are arranged in a pattern that permits at least one common region of the board to be occupied at a given time by any one of at least two different types of electronic components having respectively different voltage requirements, with the voltage requirements of the electronic component at the specific leads being served directly from the conductive layers via the terminals, whereby the common region need not be committed in advance to serve only one type of electronic component. In another aspect, a multilayer panel board has rows and columns of electrical socket terminals for receiving component pins; at least some of the rows are spaced apart from the next adjacent row by a spacing that is the same as the spacing between the parallel rows of pins of one type of component, and at least some of the columns are spaced apart from the next adjacent column by a spacing that is the same as the spacing between the parallel rows of pins of another type of component. In another aspect, at least one exposed conductive layer includes an electrically isolated region that can be dedicated to a voltage different from the remainder of the conductive layer.

36 Claims, 8 Drawing Sheets

LAYER 34 ($V_{cc}$)

FIG. 3A

LAYER 36 ($V_{ee}$)

FIG. 3B

LAYER 38 ($V_{tt}$)

FIG. 3C

LAYER 40 (G)

FIG. 3D

LAYER 44 ($V_{tt_L}$)

FIG. 3E

LAYER 42 (G)

FIG. 20 ic
PANEL BOARD

BACKGROUND OF THE INVENTION invention relates to multilayer panel boards for mounting electronic components.

Typical multilayer panel boards have sandwiches of conductive and insulative layers, including at least one conductive layer carrying a voltage and at least one grounded conductive layer. The leads of electronic components are inserted into the sockets of wire-wrap terminals mounted in the board. Posts on the other ends of the terminals are used for wrapping wire to make connections.

Leary et al., U.S. Pat. No. 4,494,172, assigned to the same assignee as this application, and incorporated herein by reference, shows a panel board having four conductive layers Two of the layers carry a first potential (e.g., +5 volts called Vcc) and the other two layers (interleaved with the first two) carry a second potential (e.g., 0 volts, or ground). One of the +5 volt layers is exposed on one surface of the board, and one of the grounded layers is exposed on the opposite board surface. Appropriate pins of transistor-transistor logic (TTL) components mounted on the board then can be easily connected either to ground or to +5 volts as needed.

Emitter-coupled logic (ECL) components typically require three potentials: 0 volts ($V_{cc}$), −2 volts ($V^{tt}$), and −5 volts ($V^{ee}$).

It is known to mount both TTL and ECL components on a single dedicated circuit board.

SUMMARY OF THE INVENTION

A general feature of the invention is a multilayer panel board for mounting electronic components that have different voltage requirements at specific leads; conductive layers carry the different voltages across the board; terminals at locations across the board receive leads of the electronic components; some of the terminals are electrically connected directly to selected conductive layers to deliver corresponding voltages from the conductive layers to the specific leads; and the terminals are arranged in a pattern that permits at least one common region of the board to be occupied at a given time by any one of at least two different types of electronic components having respectively different voltage requirements, with the voltage requirements of any electronic component at its specific leads being served directly from the conductive layers via the terminals, whereby the common region need not be committed in advance to serve only one type of electronic component and the available space on the board may be used efficiently.

Preferred embodiments of the invention include the following features. The component leads are pins and the terminals are electrical socket terminals mounted in the board for receiving the pins. At least one of the electronic components has two parallel rows of leads, the terminals are arranged in two corresponding rows or columns to receive the leads, and each of the components occupies at least part of the common region when its leads are mounted in the appropriate terminals. When the voltages are delivered to the specific leads via the directly connected terminals, all other leads of the component are held in wire-wrap socket terminals that are not directly connected to any of the conductive layers.

The pattern includes both rows of terminals to receive leads of one type of component and columns of terminals to receive the leads of another type of component. One set of conductive layers carry voltages that serve the voltage requirements of one type of component, and another set of conductive layers carry voltages that serve the voltage requirements of another type of component. Each type of component requires a ground; and the two sets of layers include two separate electrically independent layers for respectively providing the grounds to the two different types of components.

One component type is TTL and another is ECL; one set of layers provides ground, −2, and −5 volts to the ECL components, and the other set of layers supplies ground and +5 volts to the TTL components. One set of layers includes a layer that carries a first voltage and is sandwiched closely between two other layers carrying at least a second voltage in order to establish a large distributed capacitance among the layers. The two other layers of the closely spaced sandwich are interconnected at regular intervals by connections made through the board.

The terminal holes include clearance holes and connection holes in the various layers such that each terminal is selectively insulated from some of the layers by the clearance holes and some of the terminals are electrically connected directly to at least one of the layers by the connection holes. There are also conductive holes through the board each of which electrically connects at least one of the layers directly to an exposed surface of the board for making connections to electrical leads. There are a plurality of regularly distributed through holes across the board connecting a given layer to the exposed surface.

There are two exposed conductive layers which respectively carry electrically independent grounds for two different types of components. Each conductive layer includes linear gaps adjacent some of the connection holes for obstructing the heat dissipation paths across the layers that would otherwise exist. The terminal pattern repeats across the board in both dimensions.

In some embodiments, the board also includes a universal region having a rectilinear grid of terminals for receiving the leads of other electronic components, the universal regions include isolated regions on the conductive layers exposed on opposite sides of the board.

The pattern is arranged on a rectilinear grid of points spaced at the same intervals in both directions; only some of the points of the grid are occupied by terminals. The pattern includes rows and columns of terminals in which every grid point along each row and column is occupied by a terminal. The columns are organized in pairs such that the spacing between columns in each pair is 0.3 inches. At regular intervals along one column of each pair are terminals that are directly connected to one of the conductive layers, and at regular intervals along another column of each pair are terminals that are directly connected to another one of the conductive layers; the directly connected terminals in one column are staggered (e.g., by 0.7 inches along the columns) relative to the directly connected terminals of the other column. The directly connected terminals are spaced at 1.0 inch intervals along each column.

Similarly, the rows are organized in pairs such that the spacing between rows in each pair is 0.4 inches. At regular intervals along one row of each pair are terminals that are directly connected to one of the conductive layers, and at regular intervals along another row of each pair are terminals that are directly connected to another one of the conductive layers. The directly connected terminals are spaced at 1.5 inch intervals along each of the rows. Each pair of rows is part of a triplet of rows which further comprises a third row parallel to and spaced 0.1 inches from one of the other two rows. The triplets are spaced apart by one, two, or three rows in the grid. The pattern that is repeated extends twenty grid points in one direction and fifteen grid points in the other direction. The repeating pattern includes columns of through holes connected to specific ones of the conductive layers. The repeated pattern is the pattern of FIG. 3.

The pattern includes intersecting rows and columns arranged to receive one type of component along the rows and another type of component along the columns, each row includes terminals connected directly to selected layers for serving the voltage requirements of one type of component, and each column includes terminals connected directly to selected layers for serving the voltage requirements of the other type of component; and no column shares any directly connected terminal in common with any row.

Another general feature of the invention provides a multilayer panel board having rows and columns of electrical socket terminals for receiving component pins; at least some of the rows are spaced apart from the next adjacent row by a spacing that is the same as the spacing between the parallel rows of pins of one type of component, and at least some of the columns are spaced apart from the next adjacent column by a spacing that is the same as the spacing between the parallel rows of pins of another type of component.

Another general feature of the invention provides a board having at least one exposed conductive layer that includes a region which is electrically isolated from the remainder of the exposed conductive layer; terminals are mounted within the region for receiving pins of electrical components; each terminal is electrically isolated by a clearance hole in the region, whereby the isolated region may be dedicated to a first voltage that is possibly different from a second voltage to which the remainder of the exposed conductive layer is dedicated, and any terminal may be dedicated to the first voltage by direct connection to the isolated region.

Preferred embodiments include the following features. The terminals are mounted at points that lie on a rectangular grid and every point in the rectangular grid is occupied by one of the terminals. The spacing of the terminals is 0.1 inches in both dimensions of the grid. There is a second exposed conductive layer on the opposite side of the board and it too has a region that is electrically isolated from the remainder of the second layer.

The panel board of the invention accommodates two types of components having different voltage requirements without severely limiting the board position of each type. The space available on the board may be used efficiently. In particular, both ECL and TTL devices may be accommodated. Both 0.3 and 0.4 inch ECL and 0.3, 0.4, and 0.6 inch TTL packages may be mounted. In some embodiments, at least a portion of the same board can also accommodate 0.6 inch ECL and grid array packages. All of the conductive planes, being continuous (interrupted only by terminal holes), have low inductance and a high power distribution capacity. The close sandwiching of conductive layers assures a high distributed capacitance. Five different potentials are distributed to all parts of the board, two for TTL and three for ECL. Additional decoupling capacitors may be easily accommodated. In the case of the universal pattern parts of the board, the user may define the voltages carried by the conductive layers. The power pins of an integrated circuit are dedicated directly to voltage or ground without requiring high inductance wire wrapping. Circuit changes may be made easily and quickly. When properly positioned, SIP resistor packages are automatically terminated to $V_{tt}$ ($-2$ volts) and require minimum lead length when connecting the terminating resistor to the IC. Surface mount or disc capacitors may be mounted within 1 inch of every mounted component and be dedicated to $-5$, 2 or $+5$ volts. The board is especially useful for circuits operating at frequencies of 50 MHz or higher, where ECL components are chosen as part or all of the logic required to achieve the desired system speed.

Other advantages and features will become apparent from the following description of the preferred embodiment, and from the claims.

DESCRIPTION OF THE PREFERRED EMBODIMENT

We first briefly describe the drawings.

STRUCTURE

Figure 1:
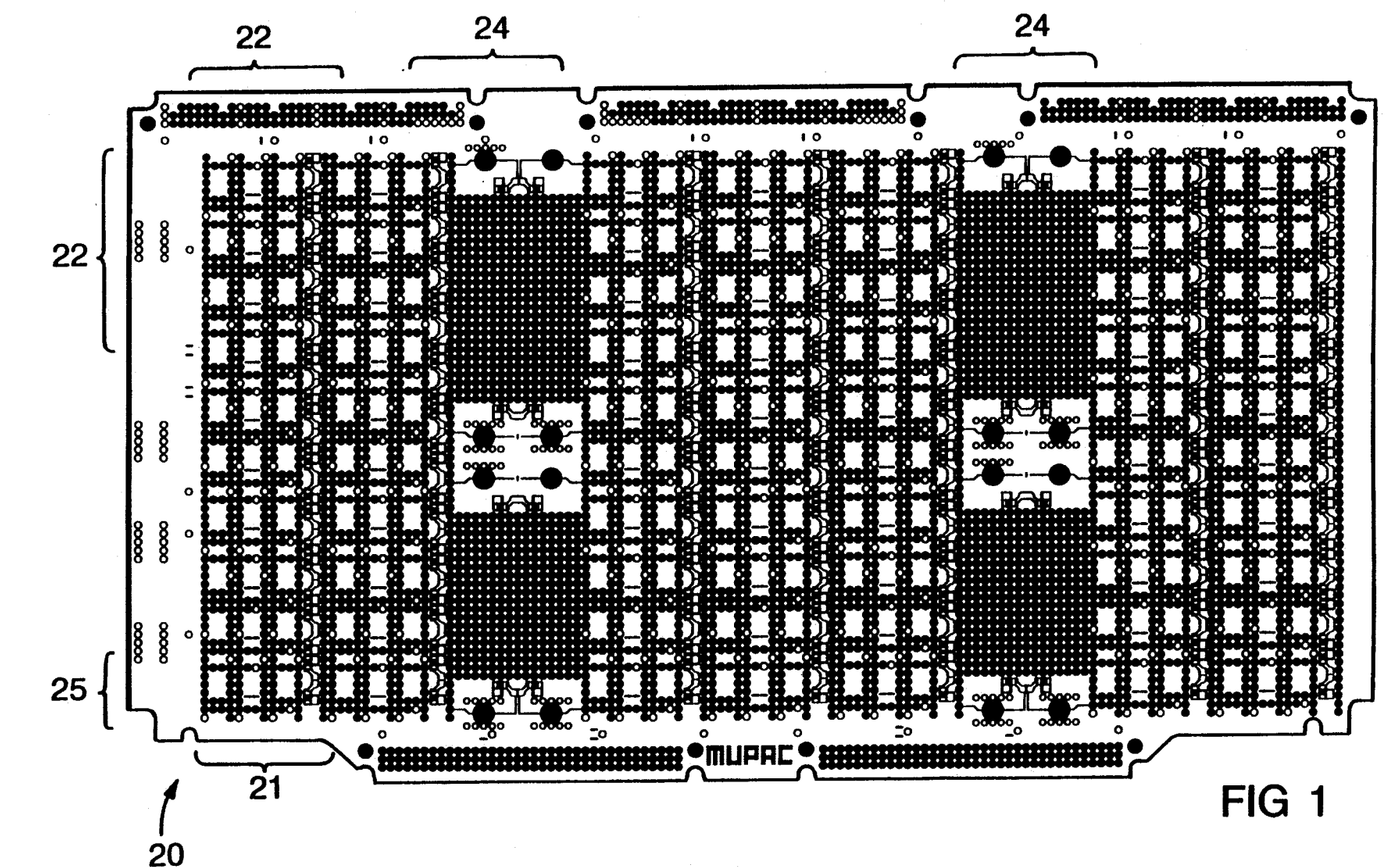
FIG. 1 is a top view of the exposed conductive layer on the component side of a multilayer panel board prior to assembly of the layers.

Referring to FIG. 1, a multilayer panel board 20 is represented by the exposed conductive layer on the component side as it appears prior to assembly of the layers of the board, hole drilling, configuration routing or insertion of socket terminals. White represents metal, black represents absence of metal. Board 20 has a first (TTL-ECL) pattern 22 (which is repeated in both directions across the board) and a second (universal) pattern 24 (which is repeated in two regions of the board). The patterns include (in the finished board) plated-through holes and holes for wire-wrap socket terminals that are used to mount and electrically interconnect integrated circuits (ICs) contained in dual in-line and single in-line packages (DIPs and SIPs), and other components.

Board 20 has nine successive columns (e.g., column 21) of patterns. The first two, last two, and middle three columns each have three complete copies plus a seventh partial copy 25 of TTL-ECL pattern 22. The third and seventh columns bear universal pattern regions 24.

Figure 2:
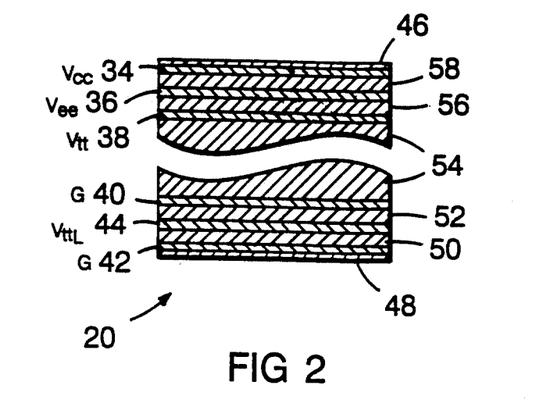
FIG. 2 is an enlarged, broken-away, sectional side view of a representative portion of the board of FIG. 1.

Referring to FIG. 2, board 20 has six conductive copper layers for distributing power, to, e.g., the ICs; three layers for ECL ICs; and three for TTL ICs. The three ECL layers 34, 36, 38 are respectively intended to be connected to a first ground ($V_{cc}$), a $-5$ volt source ($V_{ee}$), and a $-2$ volt source ($V_{tt}$). The three TTL layers are layers 40, 42 (which are connected together, as described below, and are both connected to a second ground (G)), and layer 44, connected to a $+5$ volt source ($V_{ttL}$).

Layers 34, 36, 38, 40, 42, 44 are each 0.0027 inch thick (preferred range 0.0025 inch to 0.0029 inch) and are separated (as shown) by five insulation layers 50, 52, 54, 56, 58 of glass epoxy. Epoxy layers 50, 52 are thin enough, 0.008 inch thick (preferred range 0.005 inch to 0.009 inch), to establish a large distributed capacitance of about 0.03 microfarads between $V_{ttL}$ layer 44 and G layers 40, 42. Epoxy layers 56, 58 are likewise 0.008 inch thick (preferred range 0.005 inch to 0.009 inch) to establish a large distributed capacitance of about 0.03 microfarads between $V_{ee}$ layer 36 and $V_{cc}$, $V_{tt}$ layers 34, 38. Epoxy layer 54 is 0.102 inch thick (preferred range 0.100 inch to 0.104 inch). Tin coating layers 46, 48 are preferably 0.0003-0.001 inch thick.

Figure 3:
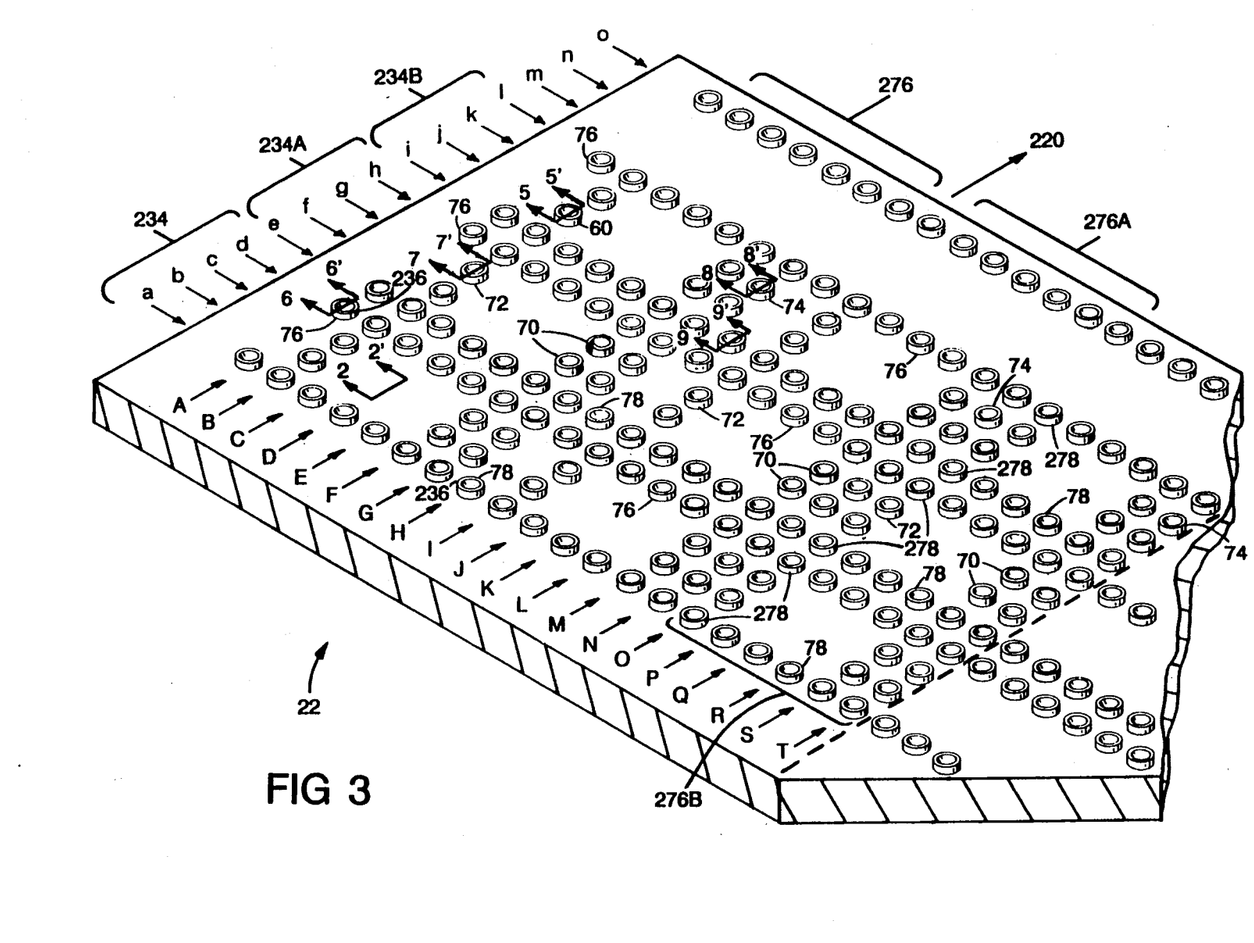
FIG. 3 is an enlarged isometric view of representative portions of the component side of a portion of the board with socket terminals mounted.

Referring to FIG. 3, TTL-ECL pattern 22 includes a regular arrangement of wire-wrap socket terminals located at some but not all of the points of a rectilinear grid having a 0.1 inch point spacing. The terminals are interference fitted in holes in the layers of board 20. A majority of the terminals on board 20 are universal terminals (e.g. at terminal position 60) which are not electrically connected (without further steps described below) to any of the copper layers 34, 36, 38, 40, 42, 44. In addition, the terminals at the following specifically labeled terminal positions are electrically connected to copper layers as indicated: terminals 70 to $V_{cc}$ layer 34; terminals 72 to $V_{ee}$ layer 36; terminals 74 to $V_{tt}$ layer 38; terminals 76 to $V_{ttL}$ layer 44; terminals 78 to G layer 42 (and to G layer 40). Terminals 70, 72, 74, 76, 78 are respectively regularly distributed across board 20.

Figure 4A:
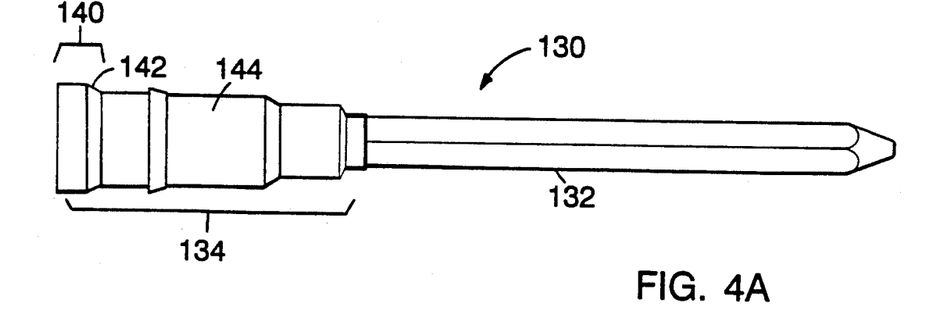
FIGS. 4A, 4B are enlarged side views of the socket terminals of FIG. 3.
Figure 4B:
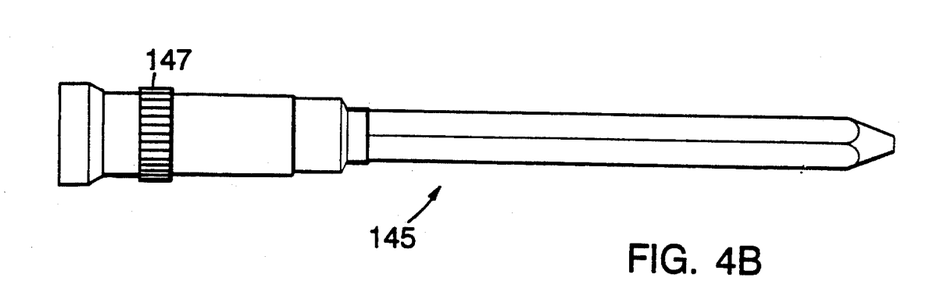
Figure 5:
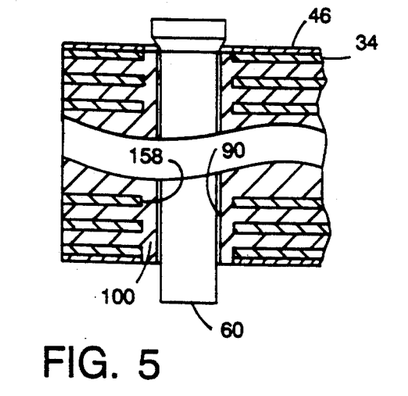
FIGS. 5, 6, 7, 8, 9, 10 are enlarged side views of the side views (at 5-5', 6-6', 7-7', 8-8', 9-9', and 10-10' of FIG. 3), not to scale, showing the mounting configurations, respectively, of universal socket terminals and socket terminals that are dedicated, respectively, to $V_{ttL}$, $V_{ee}$, $V_{tt}$, G, and $V_{cc}$ layers.
Figure 6:
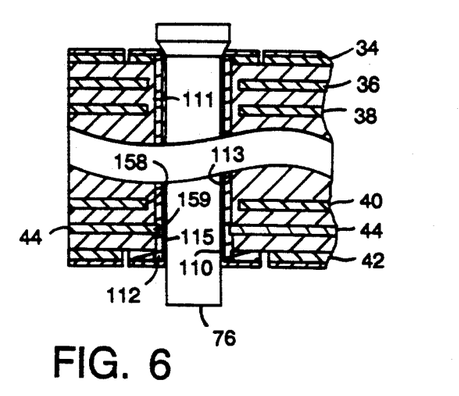
Figure 7:
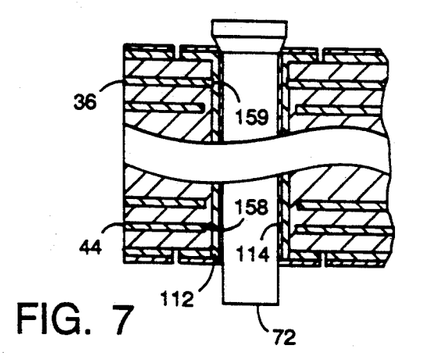
Figure 8:
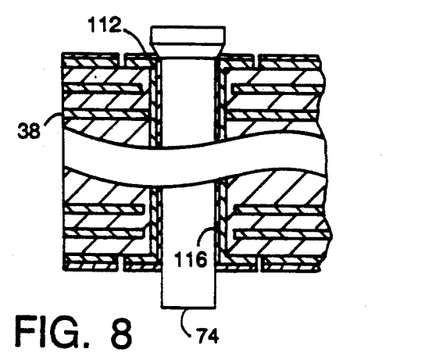
Figure 9:
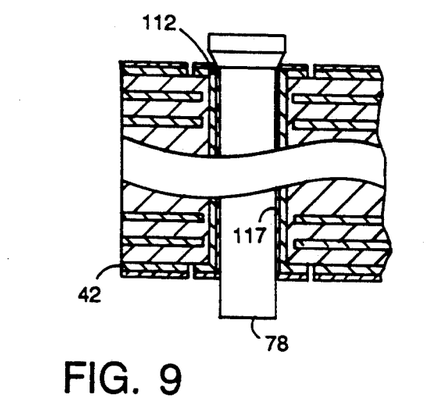
Figure 10:
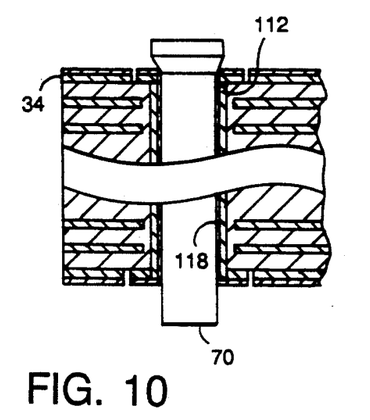
Figure 11:
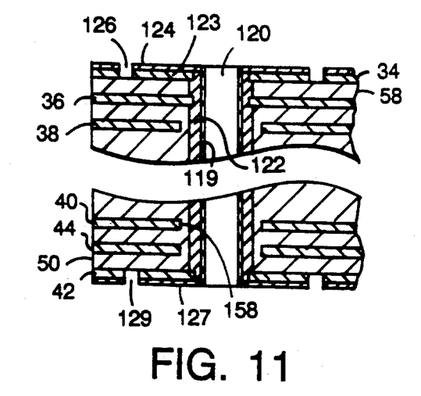
FIGS. 11, 12, 13, 14 are enlarged, sectional side views (at 11-11', 12-12', 13-13', 14-14', 15-15' of FIG. 3), not to scale, showing plated-through hole configurations respectively for $V_{ee}$, $V_{tt}$, G, $V_{ttL}$, and $V_{cc}$.
Figure 12:
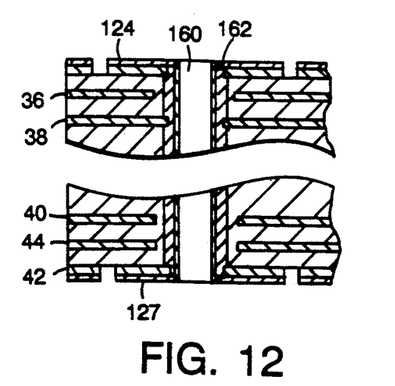
Figure 13:
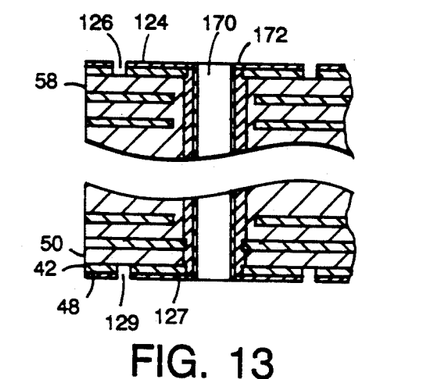
Figure 14:
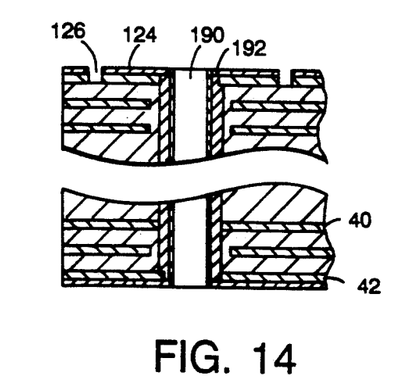

Referring to FIG. 4A, each wire-wrap socket terminal 130 connected to a voltage or ground is made of gold over-nickel-plated, half-hard, yellow brass. On one end is a solid 0.025 inch square post 132 of a selected length (preferred range 0.305 inch to 0.550 inch) to hold wrapped wire for making electrical connections. On the other end of terminal 130, round portion 134 has a socket for receiving a pin of a DIP or other component. Socket head 140 has a tapered section 142 which allows the use of a large diameter head 140, enabling easier insertion of component leads and pins. Shaft 144 is held by interference fit in a hole in board 20. FIG. 4B shows the configuration of the universal terminals 145 which have a knurled section 147, rather than a barb 149 (FIG. 4A).

Referring to FIGS. 3A-3F, prior to assembly, the six conductive layers 34, 36, 38, 40, 44, 42 have arrangements of hole positions (black dots and circles) and non-hole terminal positions (black) within pattern 22 that enable each terminal to be connected directly to the appropriate layers or, in the case of a universal terminal, to remain unconnected to any layer. For example, terminal position (B,j) on all six layers is a clearance hole that is larger in diameter than the terminal shaft, thus insulating the terminal from all layers. (Note that the terminal positions are identified by lettered row and lettered column.) As another example, each of the terminal positions (B,g), (I,g), (O,g) has clearance holes on layers 38, 40, 44 and no hole on layer 36 (to which the terminal at position 72 is to be connected). During fabrication a smaller diameter hole is drilled through the board, including layer 36, for making electrical contact to the terminal. The circle at each position (B,g), (I,g), (O,g) on layers 34 and 42 represents a clearance hole.

FIGS. 5-10 show in cross-section the manner in which the various terminal positions are configured to make the proper connections, or no connection, between a mounted terminal and the conductive layers of the board.

Referring to FIGS. 3A-3F and 5, each universal socket terminal 60 (e.g., at position [B,j]) is interference fitted into a hole 90, diameter 0.056" (preferred range 0.055" to 0.056"). Hole 90 extends through an epoxy section 100 which spans the full thickness of board 20 and insulates terminal 60 from layers 34, 36, 38, 40, 42, 44. Circular clearance holes 158, diameter 0.087 inch (preferred range 0.085 inch to 0.089 inch) have been etched in the conductive layer before fabrication of board 30. Tapered section 142 of the socket terminal (FIG. 4) prevents head 140 from short-circuiting against layer 34 or plating 46.

Referring to FIGS. 3A-3F, and 6, each $V_{ttL}$ socket terminal 76 (located at the positions where rows A and K intersect columns d and h, FIGS. 3A-3F) is interference fitted into a hole 110 in a sleeve 112 of 0.0005 inch tin plating which lines the inside of a hole 113. Clearance holes 158 have been etched in layers 34, 36, 38, 40, and 42, which are thus insulated from terminal 76. Instead of a clearance hole 158, $V_{ttL}$ layer 44 is provided with a connection hole 159 (drilled after fabrication) smaller in diameter than 0.090 inch clearance holes 158. Hole 159, diameter 0.056 inch (preferred range 0.055 inch to 0.056 inch), is sufficiently small that sleeve 112, and thus terminal 76, is in electrical contact with $V_{ttL}$ layer 44. The hole 113 in the epoxy layers is smaller than clearance holes 158 but larger than same diameter as connection holes 159. The diameter of the inside wall 115 in sleeve 112 is preferably in the range 0.055 to 0.059 inches.

Referring to FIGS. 3A-3F, and 7, the mounting configuration for a $V_{ee}$ terminal 72 (located at the positions where row B, I, O intersect column g) in a hole 114 is similar to that of a terminal 76 (FIG. 6), except that a clearance hole 158 has been etched in $V_{ttL}$ layer 44 (which is thus insulated from sleeve 112) while a connection hole 159 has been drilled in $V_{ee}$ layer 36, which is thus electrically connected to sleeve 112.

Similarly, referring to FIGS. 3A-3F, 8, 9, and 10, in the respective mounting configurations of a $V_{tt}$ terminal 74 (at positions where rows G, N, T intersect column k), a G terminal 78 (at positions where rows H, R intersect columns a, e, j, excluding position (H,j), and a $V_{cc}$ terminal 70 (at positions where rows F, M, S intersect columns f, g), it is respectively only the layer 38, 42, and 34 which is provided with a connection hole 159 and is thus electrically connected to the terminal.

Referring again to FIGS. 3A-3F, pattern 22 also includes other plated-through holes arranged in column n and connected to one or more of the layers 34, 36, 38, 40, 42, 44 as follows (the pattern of plated through holes is not shown on FIG. 3).

Figure 3A:
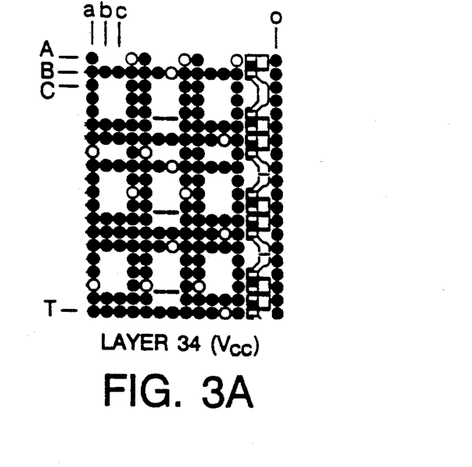
FIGS. 3A–3F are top views of representative portions of the six conductive layers of the board, prior to assembly.
Figure 3B:
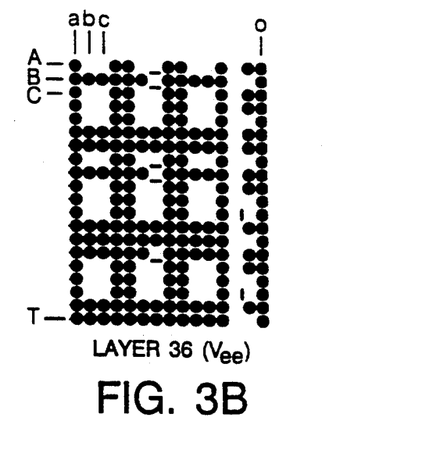
Figure 3C:
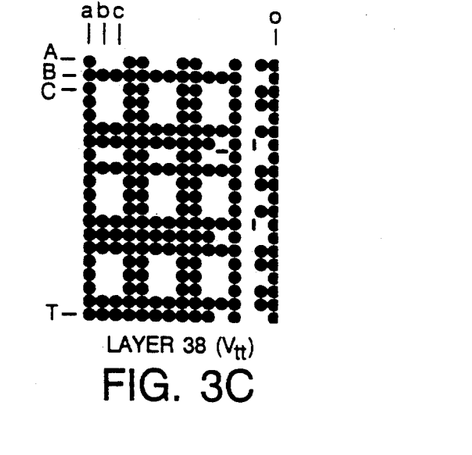
Figure 3D:
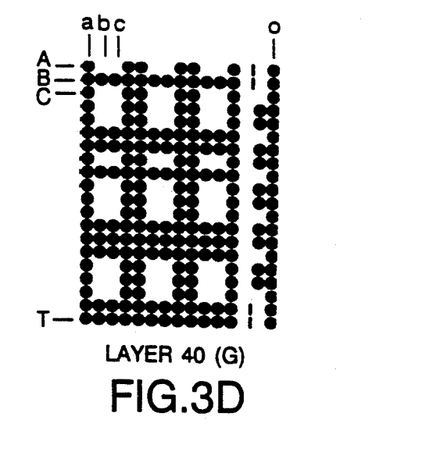
Figure 3E:
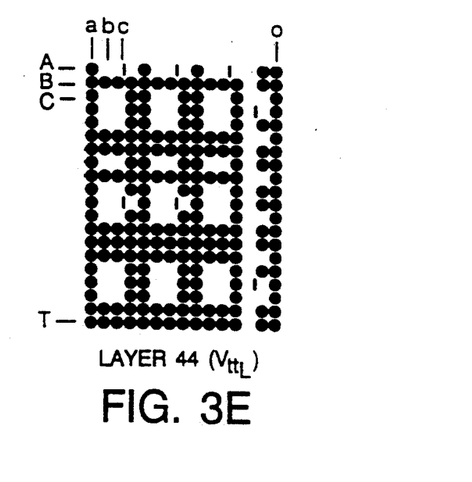
Figure 3F:
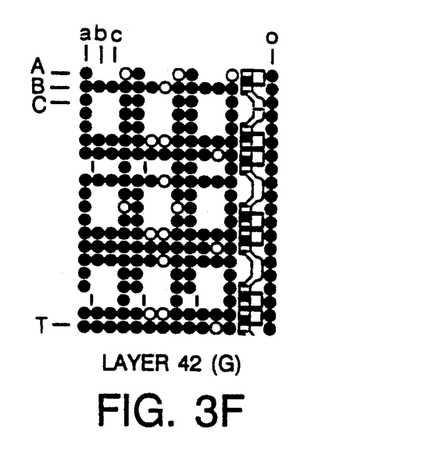

Referring to FIGS. 3A-3F and 11, each plated through hole located in positions (R,N) and (L,n) and called an e hole, is of diameter 0.037 (preferred range 0.034 to 0.040), and has a copper-plated sleeve 122. The inside hole 119 in sleeve 122 is preferably of diameter 0.041 inch (preferred range 0.040 to 0.042). Sleeve 122 is insulated from layers 38, 40, 44 (which are provided with clearance holes 158) and is electrically connected to $V_{ee}$ layer 36 (which is provided with a connection hole 159). Sleeve 122 is also electrically connected to a pad 124 (whose shape is shown in FIG. 3A) on the outer surface of epoxy layer 58. Pad 124 is comprised of a section of tin layer 46 and a section of layer 34. Pad 124, and thus sleeve 122, is insulated from the remainder of $V_{cc}$ layer 34 and tin layer 46 by a gap 126 extending around pad 124 between the pad and $V_{cc}$ layer 34 (and tin layer 46). Similarly, sleeve 122 is electrically connected to a pad 127 on the outer surface of epoxy layer 50. Pad 127 is insulated from G layer 42 (and tin layer 48) by a gap 129. Pads 124, 127 and holes 120 provide locations for the physical mounting of SMD (surface mounted device) capacitors for electrical connection to $V_{ee}$ layer 36. The e holes are not shown as holes in FIG. 3A but the holes appear in the completed board.

Similarly, referring to FIGS. 3A-3F, 12, 13, each plated-through hole in positions (G,n), (M,n) and positions (D,n), (Q,n)) (called, respectively a t hole and an L hole) has a sleeve 162, 172, respectively, electrically connected to a pad 124. Each sleeve 162 is electrically insulated from layers 36, 40, and 44 and is electrically connected to $V_{tt}$ layer 38 (which is provided with a connection hole 159). Similarly, each sleeve 172 is electrically insulated from layers 36, 38, 40 and is electrically connected to $V_{ttL}$ layer 44.

Similarly, referring to FIG. 3A-3F, and 14, each plated-through hole at positions (A,n), (B,n), (S,n), (T,n) (called a q hole) has a sleeve 192 that is electrically insulated from plates 36. 38, 44, and electrically connected to a pad 124 and to G layer 40. Thus sleeve 192 electrically interconnects G layers 40 and 42. There is a regular array across the board of such interconnections between layers 40, 42.

Figure 16:
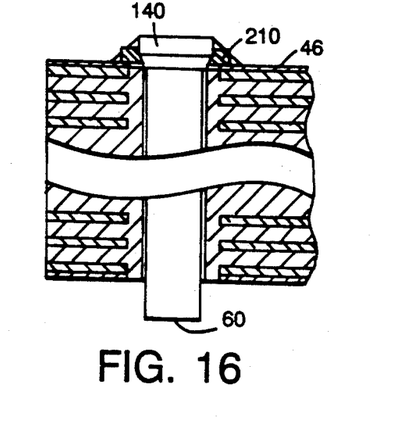
FIGS. 16, 17 are enlarged, sectional side views, not to scale, of the terminal of FIG. 4, in respectively two different soldered ring mounting configurations.

Referring to FIG. 16, any universal terminal, e.g., 60, can be electrically connected to $V_{cc}$ layer 34 (without requiring a wire-wrapped connection) by soldering a copper ring 210 both to head 140 and tin layer 46.

Figure 17:
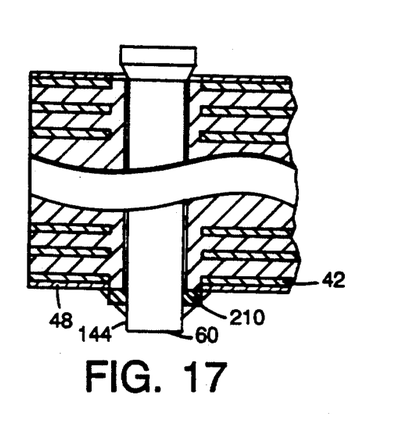

Similarly, referring to FIG. 17, any universal terminal can be directly connected to G layer 42 by soldering a copper ring 210 both to shaft 144 and tin layer 48. This enables any universal terminal to be dedicated to $V_{cc}$ or G. When not so dedicated, the shaft of each universal terminal may be used for wire-wrapping, e.g., logic connections.

Referring again to FIG. 3, within pattern 22, columns a and d, e and h, i and 1, are arranged in pairs 234 with the columns of each pair preferably spaced apart 0.300 inch (e.g., from the center of a socket terminal in column a to the center of a corresponding socket terminal in column d). Adjacent pairs, e.g., 234, 234A, are preferably spaced apart 0.100 inch.

Column o is spaced apart 0.300 inch from column 1 of column pair 234B (and thus 0.600 inch from column i of column pair 234B) The next repetition of pattern 22 (not shown) begins with a column that is 0.100 inches from column O.

Figure 18:
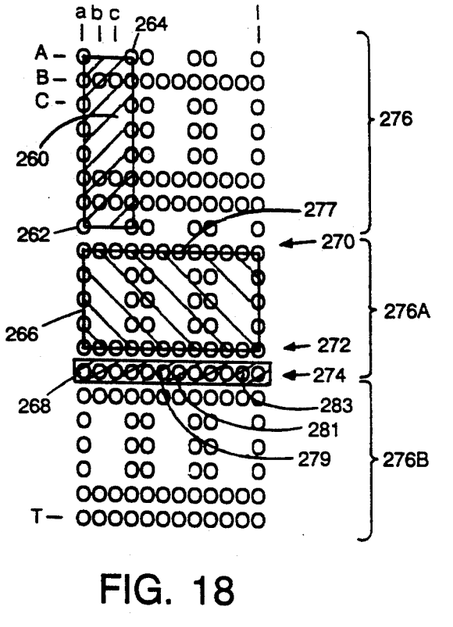
FIGS. 18, 19, 20 are top views of one of the TTL-ECL hole patterns of the board, showing possible configurations of mounted integrated circuits.

Referring to FIGS. 3 and 18, the spacing between the columns (e.g., a and d) of each pair 234 is suited to the pin spacings of conventional ICs, especially conventional 16 pin TTL DIP ICs, e.g., 260, which generally have 0.300 inch pin spacing. TTL DIP ICs also typically have a standard pin configuration which includes a pin 262 (generally 'pin 8' on IC 260) which must be connected to ground (i.e. to G layer 42) and a pin 264 (generally 'pin 16') which must be connected to a +5 volt source (i.e. to $V_{ttL}$ plate 44). To accommodate this standard pin configuration, $V_{ttL}$ ground terminals 78 (which are electrically connected to G layer 42) are regularly spaced along, e g., column a, and $V_{ttL}$ terminals 76 (which are electrically connected to $V_{ttL}$ layer 44) are regularly spaced along, e.g., column d.

Within each column pair 234, terminals 76, 78 are arranged in terminal pairs 236. Within each terminal pair 236, socket terminals 78 and 76 are offset from one another, along the length of the columns, by seven terminals (0.700 inch); thus, when a TTL IC 260 is mounted on board 30, pin 262, which requires connection to ground, will be inserted into a terminal 78, and pin 264, which requires connection to a +5 volt source, will be inserted into a terminal 76. Along each pair of columns 234, each terminal pair 236 is spaced by two terminals (preferably 0.300) from the next terminal pair 236. This spacing is chosen to accommodate, e.g., rows I, J (as described below). TTL-ECL pattern 22 is arranged so that none of the terminals connected to any of layers 34, 36, 38, 40, 42, and 44, other than terminals 78, are situated in column a, e, or i. Similarly, of the terminals connected to layers 34, 36, 40, 42, 44, only terminals 76 are situated in column d, h, or l. Thus all other terminals in those columns are universal terminals permitting logic connections to all pins of a TTL IC 260, except pins 262, 264.

To accommodate ECL ICs, rows (B, F, G), (I, M, N), (O, S, T) are arranged in triplets, e.g., 276 with rows B and F, I and M, and O and S spaced 0.400 inch apart (from the center of a socket terminal in one row to the center of a socket terminal in the other row). Rows F and G, M and N, and S and T are spaced 0.100 inch apart.

Successive triplets 276 are arranged along columns, e.g., a and d so as to minimize the distance between adjacent triplets but without having any of the rows B, F, G, I, M, N, O, S, T include any of the $V_{ttL}$ or ground terminals (i.e., terminals 76 and 78) provided for TTL IC's; thus, e.g., triplet 276 and triplet 276A are spaced one terminal apart (0.200 inch) so that the $V_{ttL}$ terminals 78 located between row G of triplet 276 and row I of triplet 276A are not included in any row B, F, G, I, M, N, O, S, T. Likewise, the G terminals 76 located between rows B and F of triplet 276A are not included in any row B, F, G, I, M, N, O, S, T.

In contrast to the spacing between triplets 276 and 276A, triplet 276B is located directly adjacent to triplet 276A (that is, with a spacing of 0.100 inch). This is possible because no $V_{ttL}$ terminals 76 or G terminals 78 are situated in positions 278.

The spacing between rows (B, F, G), (I, M, N), (O, S, T) of each triplet 276 is suited to the pin spacings of conventional ICs, especially twenty-four pin ECL DIP ICs, e.g., 266, and conventional eight-, ten-, or twelve-pin resistor SIP ICs, e.g., 268. ECL ICs 266 generally have a 0.400 inch pin spacing, corresponding to the spacing between rows (B, F), (I, M), (O, S).

The pin configuration along rows (B, F), (I, M), (O, S) is arranged to accept the standard pin configuration generally found on twenty-four pin ECL ICs. This configuration includes a pin 277 (generally 'pin 18' on IC 266) which must be electrically connected to a −5 volt source (i.e., $V_{ee}$ layer 36), and two pins 279, 281 (generally 'pins 6 and 7') which must be electrically connected to ground (i.e., $V_{cc}$ layer 34). To accommodate this configuration, row B, I, O has a $V_{ee}$ terminal 72 at the position corresponding to pin 277 (that is, in column g) and $V_{cc}$ terminals 70 at the positions corresponding to pins 279, 281 (that is in columns f, g).

The pin configuration of SIP IC 268, when used in conjunction with an ECL IC 266, includes a pin 283 (generally 'pin 12') which must be connected to a −2 volt source (i.e., $V_{tt}$ plate 38) (to allow SIP IC 268 to be connected in a 'tie-down' configuration to ECL IC 266). Row G, N, T therefore has a $V_{tt}$ terminal 74 at the position corresponding to pin 283 (that is in column k).

Figure 21:
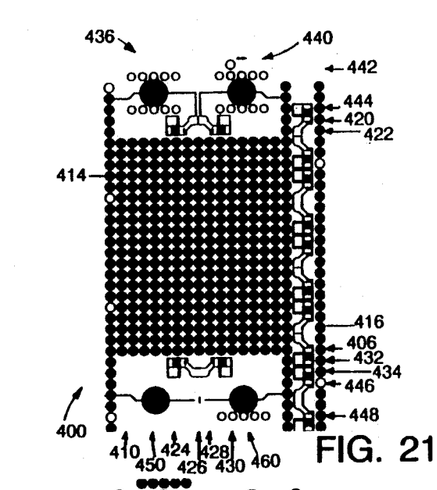
FIGS. 21–26 are top views of representative portions of the universal regions of the six conductive layers of the board, prior to assembly.
Figure 22:
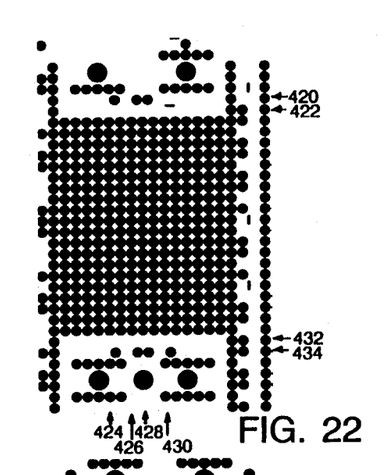
Figure 23:
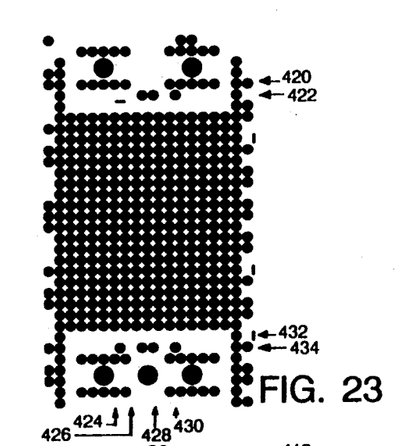
Figure 24:
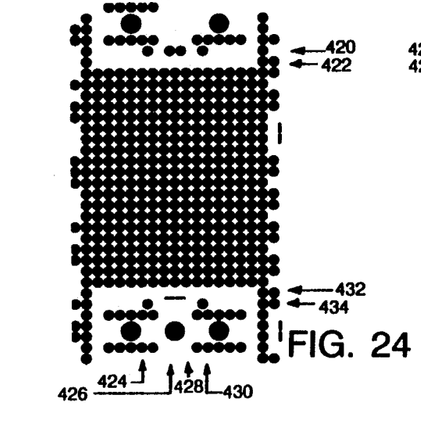
Figure 25:
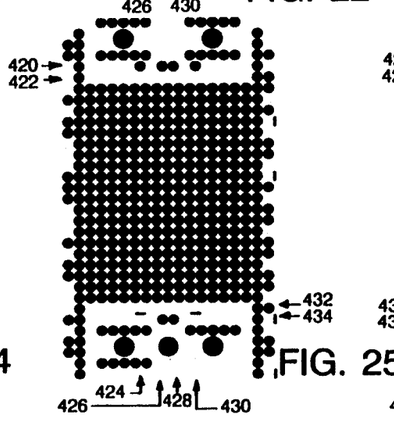
Figure 26:
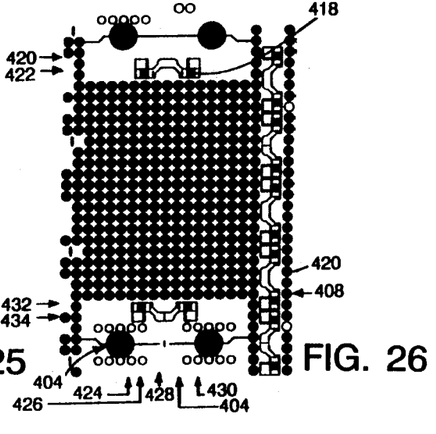

Referring to FIGS. 21-26, in each universal region 400 the two exposed layers 34, 43 respectively include corresponding power islands that are each completely electrically isolated from the surrounding regions by peripheral gap 402, 404 (FIGS. 21, 26). Within each isolated region is a rectilinear grid of universal terminals mounted along rows (406, 408) and columns (410, 412) Clearance holes are provided as shown in all six layers 34, 36, 38, 40, 44, 46 for the universal terminals. As before, each universal terminal can be dedicated directly to either the top or bottom layer 34, 46, by a soldered washer. Because every position in each rectangular grid has a universal terminal it is possible to mount a wide variety of devices (e.g., grid arrays) in the universal region, including those whose pin spacings do not conform to the requirements of the rest of the board.

At the upper and lower margins of each power island is a filter capacitor interconnection matrix 414, 416, 418, 420. Each matrix includes four interconnection positions (identified by row and column reference numbers at the periphery of each FIG.). At each interconnection position, a hole is drilled and plated through to form an electrical connection from the exposed layer at that position to one of the layers of the board. The following table shows the layer to which each interconnection position is connected.

| Position | | Connected to Layer |
|---|---|---|
| Row | Column | |
| 420 | 424 | 38 ($V_{tt}$) |
| 420 | 426 | 34 ($V_{cc}$) |
| 420 | 428 | 34 ($V_{cc}$) |
| 420 | 430 | 36 ($V_{ee}$) |
| 434 | 424 | 44 ($V_{ttL}$) |
| 434 | 428 | 40 (G) |
| 434 | 428 | 40 (G) |
| 434 | 430 | 44 ($V_{ttL}$) |

This enables a filter capacitor to be easily wired between $V_{cc}$ and $V_{ee}$ in row 420, or between G and $V_{ttL}$ in row 434.

Also associated with each power island are four power dedication locations 436, 440, 450, 460 which enable either of the exposed layers 34, 42 to be dedicated to any of five voltages or grounds carried on any of five layers of the board ($V_{tt}$ layer is excluded). Dedication location 436, for example, includes two rows 442, 444 of five through holes each. The five holes in row 442 are connected to layer 36; the five holes in row 444 to layer 42. Thus, by connecting all five holes of row 444 to all five holes of row 442, layer 42 is dedicated to $V_{ee}$. Similarly, layer 42 can be dedicated to G layer 40 by connecting the five holes in row 442 at location 440 to the five holes in row 444 at that location. Likewise, layer 34 can be dedicated to either $V_{cc}$ layer 34 or $V_{ttL}$ layer 44 by connecting the corresponding five holes in row 446 to the five holes in row 448 respectively at location 450, 460. (Note that some of the holes at locations 450, 460 do not actually appear in FIG. 21 because they are drilled after fabrication).

The interconnection of the pairs of five holes at any of the locations 436, 440, 450, 460 is accomplished by a metal strap (not shown) having two parallel rows of five pins each with the rows spaced apart by the same distance as rows 442, 444, so that the pins can be inserted into and soldered to the ten holes. All of the ten pins are electrically connected and the metal device is mounted to the board using a bolt passing through the large central hole between rows 442, 444.

Universal pattern 340 is suited to the pin configurations of a variety of IC and other circuit components (e.g., grid arrays), including those which cannot be mounted within TTL-ECL pattern 22 (because of the pattern of terminals having fixed electric potentials, e.g., terminal 76).

Figure 19:
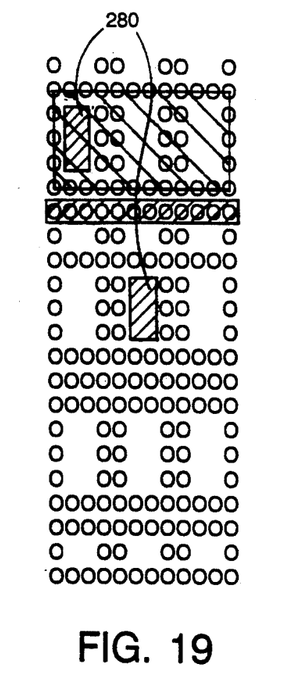

Referring to FIG. 19, because an ECL IC 266 (and an accompanying SIP IC 268) can occupy any of the triplets 276, and a TTL IC 260 can occupy any of the column pairs e.g., a and d, there exist regions 280, regularly distributed across board 30, which can be occupied by either an ECL IC 266 or a TTL IC 260. Thus the board enables ECL and TTL ICs to be mounted at a variety of locations without requiring that any portion of the board be dedicated exclusively to either ECL or TTL use.

Figure 20:
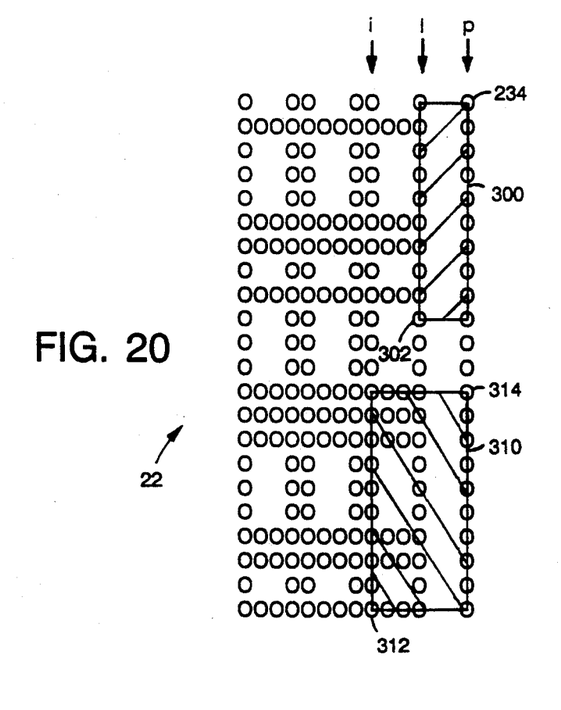

Referring to FIG. 20, other types of conventional TTL and ECL ICs can be mounted on the terminals of pattern 22.

For example, a conventional twenty pin, 0.3 inch pin spacing TTL IC 300 can be mounted on column 1 of pair 234B and column p. TTL IC 300 would typically have a standard pin configuration which includes a pin 302 (generally 'pin 20') which must be connected to a +5 volt source (i.e., $V_{ttL}$ layer 44) and a pin 304 (generally 'pin 10') which must be connected to ground. To accommodate this configuration, $V_{ttL}$ terminals 76 are positioned every ten terminals along column 1, to receive pin 302. Pin 304 is inserted into the universal terminal along column p which is offset (along the length of columns 1, p) ten terminals. That universal terminal is then connected to layer 42 using the mounting configuration depicted in FIG. 17.

Also a conventional twenty pin, 0.6 inch TTL IC 310 can be mounted on pattern 22 using column i of column pair 234B and column p. Pin 312 of IC 310, which must be connected to ground, is inserted in a G terminal 78.

Pin 314 of IC 310, which must be connected to a +5 volt source, is inserted into a universal terminal in column p which is then connected by wire wrapping to $V_{ttL}$ plate 44.

Other circuit components, including conventional DIP switches (not shown) can be mounted between column p and columns i, 1 of column pair 234B.

Figure 15:
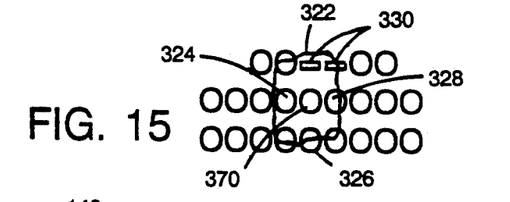
FIG. 15 is a top view of a portion of the TTL-ECL hole pattern on one layer of the board.

Referring to FIG. 15, a portion 320 of TTL-ECL hole pattern 22 on one layer of the board is shown without socket terminals. During soldering, when heat is applied to a terminal (e.g., a terminal 70 electrically connected to $V_{cc}$ layer 34) any copper layer to which the socket terminal is directly electrically connected, via a hole sleeve, e.g. 122, will tend to dissipate heat such that a longer heating time is required than would otherwise be necessary, increasing the potential for damage to the portion of the board absorbing the excess heat. During soldering, if the layer, e.g., 34, is physically interrupted (in the region 322 immediately surrounding the terminal) by other terminal holes (e.g. holes 324, 326, 328), the heat dissipating effect, in the direction of those other holes, is reduced, in effect thermally isolating the hole 320. In cases where a terminal hole does not already exist immediately adjacent to the terminal being soldered, a short gap 330 is etched in the layer to reduce the heat dissipation in that direction. Each gap 330 extends completely through the layer connected to the terminal being soldered.

Thus, for example, all holes 118 (corresponding to terminals 70), which are connected to $V_{cc}$ layer 34 and are bordered in three directions by other holes, include such a gap 330 in the fourth direction.

Gaps 330 (not shown) are also included on other layers 36, 38, 42, 44 bordering connection holes 159, corresponding to terminals 72, 74, 78, 76, respectively.

Manufacture

Referring again to FIG. 2, in one method of fabricating board 20, glass epoxy core stock (faced on both sides with copper foil) becomes layer 54 and layers 38, 40. Plates 38, 40 are each imaged, printed and etched. A second piece of glass epoxy core stock (faced on one side with copper foil) is laminated to layer 40 to form layer 52 and layer 44; a third piece of glass epoxy core stock (faced on one side with copper foil) is laminated to plate 38 to form layer 56 and plate 36. Plates 36 and 44 are then imaged, printed, and etched. A fourth and fifth piece of glass epoxy core stock (each faced on one side with copper foil) are laminated to plates 36, 44 respectively to form layers 58, 50 and plates 34, 42. These plates are then imaged, etched, and printed. On each of the copper plates the structures created by the imaging, printing, and etching described above include clearance holes 158 and gaps 330; for plate 34 and tin layer 46, gaps 126 are also included; for plate 42 and tin layer 48, gaps 129 are included.

The laminated assembly is then drilled through in the locations where connection holes 159 are to appear, using a drill having the same diameter as holes 159. The exposed copper portions of the laminated assembly are coated with an acid resistive substance, and the glass epoxy in the drilled holes is etched back to the diameter of holes 113, exposing parts of plates 34, 36, 38, 44, 42 around holes 159. The acid resist is removed and the holes are plated through. Holes for universal terminals are drilled through. The board is imaged, printed, and etched, and subjected to electro deposition tin plating, ink screening, and routing to final shape.

Other embodiments are within the following claims. For example, the universal regions could be replaced by additional patterns like pattern 22. Other types of ECL devices, e.g., 16-pin devices, could be accommodated by adjusting the arrangement of holes.

I claim:

1. A multilayer panel board for mounting two types of electronic components, that have respectively different voltage requirements at specific leads of said components, each said electronic component having leads arranged along at least one row, said board comprising
conductive layers for carrying said different voltages across said board, and
socket terminals at locations across said board for receiving leads electronic components, some said terminals being electrically connected directly to selected said conductive layers at said locations to deliver corresponding said voltages from said conductive layers to said specific leads,
said terminals being arranged in a rectilinear pattern of rows and columns that permits a common region of said board to be occupied at any given time by one of electronic component, selected said terminals being in direct mechanical and electrical contact with corresponding said layers, said pattern in said common region being characterized in that one type of component has its leads mounted in rows of terminals and another type of component has its leads mounted in columns of terminals with the voltage requirements of any electronic component at its leads being served directly from said conductive layers via said terminals,
whereby said common region need not be committed in advance to serve only one type of electronic component.

2. The board of claim 1 adapted for use with electronic components having two parallel rows of leads wherein
said terminals are arranged in two corresponding rows or columns to receive the leads of electronic components.

3. The board of claim 1 wherein, when said voltages are delivered to the leads of a component via said directly connected terminals, all other leads of A component are held in terminals that are not directly connected to any of said conductive layers.

4. The board of claim 3 wherein said terminals comprise wire-wrap socket terminals for making wire-wrap connections to other leads of A component.

5. The board of claim 1 wherein
one set of said conductive layers carry voltages that serve said voltage requirements of one type of components, and
another set of said conductive layers carry voltages that serve said voltage requirements of another type of components.

6. The board of claim 1 wherein each type of components requires a ground and said layers include two separate electrically independent layers for respectively providing said grounds to two different types of components.

7. The board of claim 5 adapted for use with electronic components where one type is TTL and another type is ECL wherein
said one set of layers provides ground, $-2$, and $-5$ volts to ECL components, and said other set of layers supplies ground and $+5$ volts to TTL components.

8. The board of claim 5 wherein said layers in one said set of layers includes a layer the carries a first voltage and is sandwiched closely between two other layers carrying at least a second voltage in order to establish a large distributed capacitance among said layers.

9. The board of claim 8 wherein said two other layers of the closely spaced sandwich are interconnected at regular intervals by connections made through the board.

10. The board of claim 5 wherein each said set of layers comprises three layers.

11. The board of claim 1 wherein said socket terminals are mounted in terminal holes in said board and said terminal holes include clearance holes and connection holes in said layers such that each terminal is selectively insulated from some of said layers by said clearance holes and some of said terminals are electrically connected directly to at least one of said layers by said connection holes.

12. The board of claim 1 further comprising conductive holes through said board each of which electrically connects at least one of said layers directly to an exposed surface of said board for making connections to electrical leads.

13. The board of claim 12 wherein there are a plurality of regularly distributed said holes across said board connecting a given said layer to said exposed surface.

14. The board of claim 1 wherein there are two exposed said conductive layers which respectively carry electrically independent grounds for two different types of components.

15. The board of claim 1 wherein each said conductive layer includes a pattern of connection holes that make electrical connection to some of said terminals and said layer includes gaps in the vicinity of some said connection holes for obstructing the heat dissipation paths from said terminals and across said layers that would otherwise exist.

16. The board of claim 15 wherein each said gap comprises a linear gap adjacent said connection hole.

17. The board of claim 1 wherein said pattern repeats across said board in both dimensions.

18. The board of claim 1 further comprising a universal region having a rectilinear grid of said terminals for receiving leads of electronic components.

19. The board of claim 18 wherein said universal region includes isolated regions of conductive layers exposed on opposite sides of said board.

20. The board of claim 1 wherein said pattern is arranged on a rectilinear grid of points spaced at the same intervals in both directions and only some of said points of the grid are occupied by said terminals.

21. The board of claim 20 wherein said pattern includes rows and columns of said terminals in which every grid point along each said row and column is occupied by a terminal.

22. The board of claim 21 wherein adjacent said columns are organized in pairs such that the spacing between columns in each said pair is 0.3 inches.

23. The board of claim 22 wherein at regular intervals along one column of each said pair are terminals that are directly connected to one of said conductive layers, and at regular intervals along another column of each said pair are terminals that are directly connected to another one of said conductive layers and the directly connected terminals in one said column are staggered relative to the directly connected terminals of the other said column.

24. The board of claim 23 wherein said terminals are staggered by 0.7 inches along said columns.

25. The board of claim 24 wherein said directly connected terminals are spaced at 1.0 inch intervals along each of said columns.

26. The board of claim 21 wherein adjacent said rows are organized in pairs such that the spacing between rows in each said pair is 0.4 inches.

27. The board of claim 26 wherein at regular intervals along one row of each said pair are terminals that are directly connected to one of said conductive layers, and at regular intervals along another row of each said pair are terminals that are directly connected to another one of said conductive layers.

28. The board of claim 27 wherein said directly connected terminals are spaced at 1.5 inch intervals along each of said rows.

29. The board of claim 26 wherein each said pair of rows is part of a triplet of rows which further comprises a third row parallel to and spaced 0.1 inches from one of the other two rows.

30. The board of claim 29 wherein successive said triplets are spaced apart by one, two, or three rows in said grid.

31. The board of claim 20 wherein said pattern is repeated across said board in both directions and the repeating pattern extends twenty grid points in one direction and fifteen grid points in the other direction.

32. The board of claim 31 wherein said repeating pattern includes columns of through holes connected to specific ones of said conductive layers.

33. The board of claim 20 wherein said pattern is a repeating pattern across said board and said repeating pattern is the pattern of FIG. 3.

34. The board of claim 20 wherein
said pattern comprises intersecting rows and columns arranged to receive one type of component along said rows and another type of component along said columns,
each said row includes terminals connected directly to selected said layers for serving the voltage requirements of one type of component, and each said column includes terminals connected directly to selected layers for serving the voltage requirements of other type of component, and
no said column shares any said directly connected terminal in common with any said row.

35. A multilayer panel board for mounting two different types of electronic components, each electronic component having two rows of parallel pins, said different types having respectively different spacings between the two rows of pins, said panel board comprising
rows and columns of electrical socket terminals for receiving said pins,
at least some of said rows each being spaced apart from the next adjacent row by a spacing that is the same as the spacing between the parallel rows of pins of one type of component,
at least some of said columns each being spaced apart from the next adjacent column by a spacing that is the same as the spacing between the parallel rows of pins on the other type of component.

36. A multilayer panel board for mounting both ECL and TTL electronic components comprising
a rectilinear pattern of socket terminals for receiving pins of components, said pattern comprising rows for mounting ECL components and columns for mounting TTL components, and conductive layers extending across said board for carrying voltages and ground to components, some terminals in each said row being connected directly to selected said layers for providing voltage or ground to appropriate pins of ECL components, and some terminals in each said column being connected directly to selected said layers for providing voltage or ground to appropriate pins of TTL components, said rows and columns being arranged so that no row shares any said directly connected terminal with any said column.

* * * * *

UNITED STATES PATENT AND TRADEMARK OFFICE
CERTIFICATE OF CORRECTION

PATENT NO. : 5,159,536

DATED : October 27, 1992

INVENTOR(S) : Shaun D. Silverio

It is certified that error appears in the above-identified patent and that said Letters Patent is hereby corrected as shown below:

Col. 1, line 5, before "invention" insert --this-- ;

Col. 1, line 19; after "layers" (first occurrence) insert --.--;

Col. 4, line 17; before "2" insert -- - --;

Col. 4, line 44; after "enlarged" insert -- , sectional --;

Col. 5, line 56; after "72", delete "." and insert therefor -- , --;

Col. 5, line 56; after "74", delete "." and insert therefor -- , --;

Col. 5, line 56; after "76", delete "." and insert therefor -- , --;

Col. 6, line 6; before "38", delete ","; (second occurrence)

UNITED STATES PATENT AND TRADEMARK OFFICE
CERTIFICATE OF CORRECTION

PATENT NO. : 5,159,536

DATED : October 27, 1992

INVENTOR(S) : Shaun D. Silverio

It is certified that error appears in the above-identified patent and that said Letters Patent is hereby corrected as shown below:

Col. 8, line 7,; after ")", insert --.--;

Col. 9, line 36; after "412)", insert --.--;

Col. 9, line 63; after "($V_{cc}$", insert --)--; and

Col. 10, line 51; after "pin" (second occurrence), insert -- - --;

Claim 1, Col. 12, line 15; after "leads" insert --of--; (PTO mistake)

Claim 6, Col. 12, lines 57-58; delete "components" and insert therefor --component--; and Claim 8, Col. 13, line 2; delete "the" and insert therefor --that--.

Signed and Sealed this

Thirteenth Day of September, 1994

Attest:

BRUCE LEHMAN

Attesting Officer

Commissioner of Patents and Trademarks